(12) United States Patent
Glovatsky et al.

(10) Patent No.: US 6,412,168 B1
(45) Date of Patent: Jul. 2, 2002

(54) METHOD OF MAKING AN ELECTRICAL CIRCUIT BOARD

(75) Inventors: Andrew Z. Glovatsky, Livonia; Jay D. Baker, Dearborn, both of MI (US)

(73) Assignee: Visteon Global Tech, Inc., Dearborn, MI (US)

( * ) Notice: Subject to any disclaimer, the term of this patent is extended or adjusted under 35 U.S.C. 154(b) by 0 days.

(21) Appl. No.: 09/655,750

(22) Filed: Sep. 6, 2000

(51) Int. Cl.⁷ .................................................. H01K 3/10
(52) U.S. Cl. .............................. 29/852; 29/830; 29/846; 29/851
(58) Field of Search .................... 29/852, 830, 825, 29/831, 832, 851

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 4,893,404 A | * | 1/1990 | Shirahata et al. .............. 29/852 |
| 4,916,809 A | * | 4/1990 | Boudou et al. ................ 29/852 |
| 5,401,911 A | * | 3/1995 | Anderson et al. .............. 29/830 |
| 5,738,797 A | | 4/1998 | Belke, Jr. et al. |
| 5,915,757 A | * | 6/1999 | Tsuyama et al. ............... 29/852 |
| 5,956,843 A | * | 9/1999 | Mizumoto et al. ............. 29/830 |
| 6,188,028 B1 | * | 2/2001 | Haba et al. .................... 29/830 |

* cited by examiner

Primary Examiner—Carl J. Arbes
(74) Attorney, Agent, or Firm—Visteon Global Tech., Inc.

(57) ABSTRACT

A multi-layer electronic circuit board design 10 having selectively formed apertures or cavities 26.

12 Claims, 9 Drawing Sheets

US 6,412,168 B1

METHOD OF MAKING AN ELECTRICAL CIRCUIT BOARD

FIELD OF THE INVENTION

The present invention relates to an electrical circuit board and more particularly, to a multi-layer electrical circuit board having multiple circuit interconnections and having apertures and/or cavities that are formed within the circuit board and/or through various portions of the circuit board.

BACKGROUND OF THE INVENTION

Multi-layer circuit boards contain and/or include electrical components and interconnecting conductive traces or routing lines which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components and conductive traces which efficiently and densely populate the respective boards.

It is desirable to allow for communication by and between and/or interconnection of the component and trace containing surfaces and/or portions of an electrical circuit board, thereby allowing the contained electrical components and races on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more holes or cavities to be drilled and/or formed through the core of the circuit board substrate, thereby selectively creating one or more "through-hole" type vias (i.e., holes which "pass through" and/or traverse the entire circuit board or all of the opposed component containing surfaces), and one or more "blind" type vias (i.e., holes which do not "pass through" and/or traverse the entire circuit board and all of the opposed component containing surfaces). The vias are then typically filled with solder (e.g., a pin or component connector is soldered into the hole) or another conductive material. In this manner, electrical connections are made or formed which connect electrical components and/or circuitry to the core of the circuit board substrate, or to other components and/or circuitry located on the opposing side or surface of the board.

One drawback with these conventional vias when applied to this type of circuit board design is that layers of relatively non-solderable material (i.e., material which does not substantially bind or metallurgically bond with solder) are typically present within these vias, and thus, the solder does not consistently and reliably electrically connect the desired layers of circuitry and/or components together. For example and without limitation, many conventional vias include an annular portion or ring which is disposed around the via opening and is designed to hold or retain solder within the via. These annular ring type vias require an adhesive film or material to be applied underneath the ring in order to bond the ring to the circuit board core layer. This adhesive film or material is adjacent to the via and often softens and flows into the via when the circuit board substrate is laminated, thereby causing soldering defects in the subsequent circuit board construction processes. The annular ring type portions also create unfavorable surface tension when solder is inserted into the via, thereby often preventing the solder from "wetting" or metallurgically bonding to the core or bottom layer of the circuit board. In these types of situations, the solder "wets" or metallurgical bonds only to the annular ring portion, thereby creating a dome of solder that covers the via and results in a defective portion or region of the circuit board where all layers of the circuit board are not desirably interconnected. Other attempts at forming more reliable connections through vias, include plated through hole type vias. However, these types of vias are relatively difficult and expensive to produce.

There is therefore a need to overcome some or all of the previously delineated drawbacks of prior circuit board designs including improved vias or cavities for selectively interconnecting one or more layers of electrical circuitry.

SUMMARY OF THE INVENTION

It is a first object of the present invention to provide a method for producing a multi-layer electrical circuit board that overcomes some or all of the previously delineated drawbacks of prior multi-layer electrical circuit board forming methodologies and techniques.

It is a second object of the present invention to create a via, aperture or cavity which provides a highly reliable and solderable interconnection by eliminating the flow effects of adhesive materials and non-wettable substrate aperture sidewall surfaces.

It is third object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of apertures or cavities which provide for communication by and between some or all of the various component containing surfaces and portions of the formed multi-layer electrical circuit board, which selectively allows components contained within and/or upon these portions and surfaces to be interconnected, and which is further adapted to selectively and communicatively receive an electrical component and/or an electrical component connector portion.

According to a first aspect of the present invention a method for making a multi-layer electrical circuit board is provided. The method includes the steps of providing a conductive core member having a first surface; providing an insulating layer; selectively coupling the insulating layer to the first surface; attaching a conductive layer to the first insulating layer; selectively removing a portion of the insulating layer from a first region of the multi-layer circuit board; and selectively removing a portion of the conductive layer from the first region, the portion of said conductive layer cooperating with the portion of the insulating layer to form a blind via within the multi-layer circuit board which extends to the conductive core member, and being further effective to form a protrusion of the conductive layer which extends over the blind via.

According to a second aspect of the present invention a circuit board assembly is provided. The circuit board assembly includes an electrically conductive core layer having a first surface; a dielectric material coupled to the first surface of the core layer; a blind via which is formed within said dielectric material and the adhesive material and which extends to the electrically conductive core layer; and an electrically conductive member which is coupled to the adhesive material and which includes a first portion which extends over the blind via, and which is effective to draw in solder material which is selectively inserted into the blind via, thereby forming a reliable connection between the electrically conductive member the said electrically conductive core layer.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1:
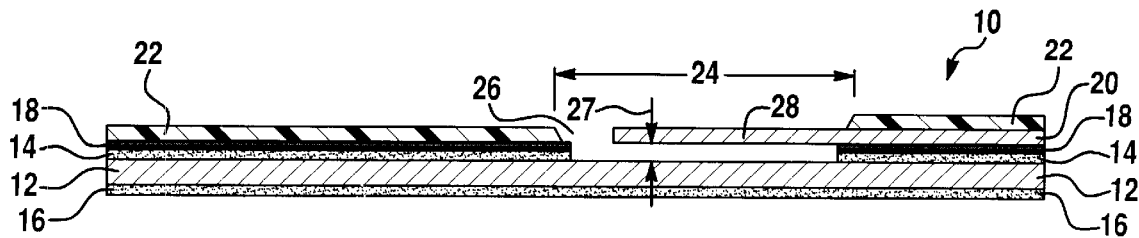
FIG. 1 is a sectional side view of a multi-layer circuit board including a "blind" via or cavity which is formed in accordance with the teachings of a first embodiment of the invention.

Referring now to FIG. 1, there is shown a circuit assembly 10 made in accordance with the teachings of a first embodiment of the invention. Circuit assembly 10 is formed by "building up" or sequentially adding various layers of certain materials to a core member 12, in a conventional manner. Core member 12 is manufactured and/or formed from an electrically conductive material such as copper or a metallic foil material. A pair of layers of insulating or dielectric material or epoxy 14, 16 are respectively applied/coupled to and "cover" the "top" and "bottom" surfaces of member 12. A layer of adhesive material 18, which in the preferred embodiment of the invention comprises a "Z-flex" adhesive material, is applied to and/or coupled to and substantially "covers" or coats the top surface of epoxy layer 14 and/or the bottom surface of an electrically conductive member 20. Member 20 is connected, coupled, and/or attached to a portion of the epoxy layer 14, by way of adhesive 18 which is disposed between and operatively bonds dielectric layer 14 and conductive layer 20. In one non-limiting embodiment of the invention, electrically conductive member 20 comprises a conventional and commercially available copper material. It should be appreciated that other metals and metal combinations can be used to form all of the circuit boards described herein, and may include metals such as aluminum, iron, nickel, silver, gold, tin and alloys thereof.

In a further non-limiting embodiment of the invention, electrically conductive member 20 is connected, coupled, and/or attached to adhesive material 18 and dielectric layer 14 by use of a known and conventional laminating process such as a conventional "one-step" laminating process. In another non-limiting embodiment, dielectric layers 14, 16 are not included and adhesive layer 18 provides sufficient insulation between conductive core 12 and conductive layer 20. Circuit assembly 10 further includes a conventional solder-mask 22 which is conventionally coupled or attached to member 20 in one portion of the circuit assemble 10 (i.e., in that portion containing member 20) and is conventionally coupled or attached to adhesive material 18 in a second portion of the circuit assembly (i.e., in that portion not containing member 20).

Certain portions of solder-mask 22, electrically conductive member 20, adhesive material 18 and dielectric material 14 have been removed from an area or region 24 of the circuit assembly 10 in a known and conventional manner such as by drilling, punching, machining and/or selective etching, thereby creating a cavity or "blind" via 26 within circuit assembly 10. Portions of members 20, 22 and 14 can be removed before or after the layers are coupled together. As shown, electrically conductive member 12 is "exposed" and/or remains within area or region 24, thereby allowing an electrical connection to be made through blind via or cavity 26 to member 12. A portion, "tab", or protrusion 28 of member 20 (e.g., that portion of member 20 not removed from portion 24) remains substantially and horizontally "suspended" and/or extending within region 24. The protrusion 28 improves solder wetting within the blind via 26. Particularly, the gap 27 which is formed between protrusion 28 and the copper core 12 is effective to attract and/or "draw in" fluids (e.g., molten solder or other conductive material) through capillary action, thereby promoting the joining and/or connection of conductive layer 20 and copper core 12. Additionally, tab 28 may be physically bent down and welded or otherwise directly bonded to core 12 for electrical interconnection.

It should be appreciated that an electrically conductive material (e.g., solder) can be disposed or placed within blind via 26, thereby allowing for the selective formation of desired interconnection strategies and/or component connection strategies. By eliminating the annular ring used in prior via designs, the adhesive which was required to hold the annular ring in place is substantially eliminated from the area or region within the via 26 where electrical connections are made. In this manner, the adhesive 18 is substantially prevented from flowing inside the via 26 during the lamination process, thereby substantially preventing the adhesive 18 from contaminating the solder area. Additionally, the perimeter or diameter of region 24 is relatively large or substantially larger than (e.g., twice as large as) the perimeter or diameter utilized in prior or conventional via designs.

The tab or protrusion 28, which extends over this larger area provides a solder interconnect area (e.g., an area where solder may be placed to mechanically and electrically connect member 20 to core member 12) which is relatively remote from the adhesive material 18, thereby further reducing the likelihood that the adhesive material 18 contaminates the solder area. The perimeter formed and/or created by the adhesive material 18 also prevents solder that is introduced into via 26 from flowing outside of via 26. Solder-mask 22 assists in preventing the flow of solder outside of via 26, but is not required due to the function of adhesive material 18. Hence, in alternate embodiments, solder-mask 22 may be eliminated.

Figure 1A:
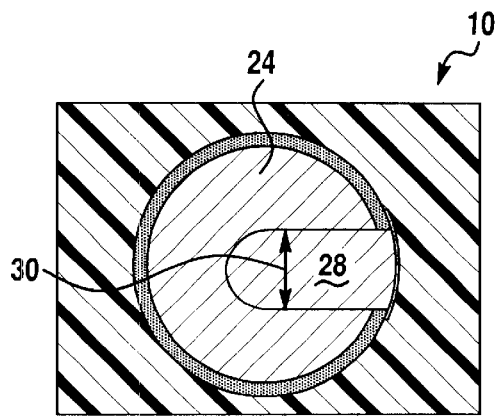
FIGS. 1a–1i are top views illustrating various non-limiting embodiments of the blind via or cavity shown in FIG. 1.
Figure 1B:
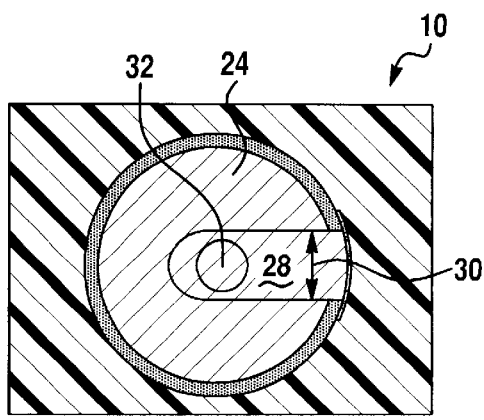
Figure 1C:
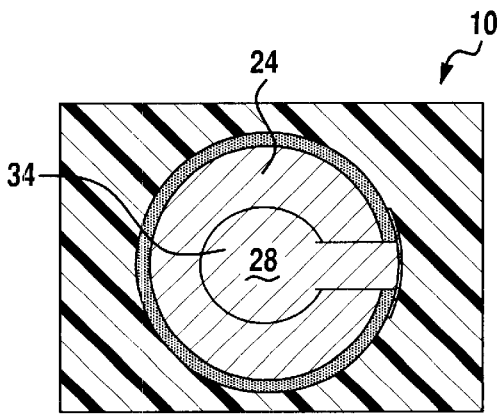
Figure 1D:
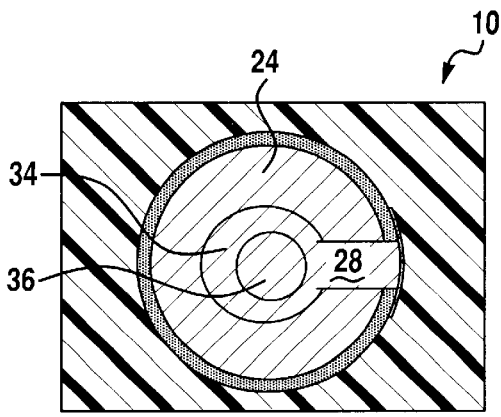
Figure 1E:
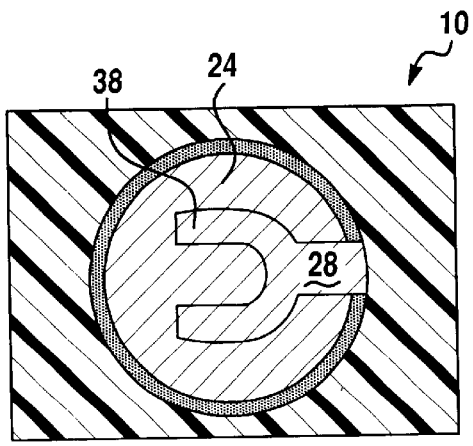

Projection 28 may be formed in a variety of manners, including for example and without limitation, the various shapes, structures and designs illustrated in FIGS. 1a–1i. In one non-limiting embodiment, which is illustrated in FIG. 1a, via-forming region 24 is generally circular in shape and has a diameter that is approximately three times as large as the width 30 of elongated protrusion 28. In another non-limiting embodiment, which is illustrated in FIG. 1b, via-forming region 24 is generally circular in shape and has a diameter that is approximately four times as large as the width 30 of protrusion 28. Protrusion 28 is generally elongated and includes a circular aperture 32, which is formed in the approximate center of symmetry of region 24 and/or via 26. In another non-limiting embodiment, which is illustrated in FIG. 1c, via-forming region 24 is generally circular in shape, and protrusion 28 is generally "pan-shaped" and has an enlarged and generally circular portion 34 which is suspended in the approximate center of symmetry of region 24 and/or via 26. In another non-limiting embodiment, which is illustrated in FIG. 1d, via-forming region 24 is generally circular in shape, and protrusion 28 is generally "pan-shaped" and has an enlarged and generally circular portion 34, including an aperture 36, which is suspended and/or disposed in the approximate center of symmetry of region 24 and/or via 26. In another non-limiting embodiment, which is illustrated in FIG. 1e, via-forming region 24 is generally circular in shape, and protrusion 28 is "forked" or "pronged" and includes a generally "U"-shaped portion 38 which is suspended and/or disposed in the approximate center of symmetry of region 24 and/or via 26.

Figure 1F:
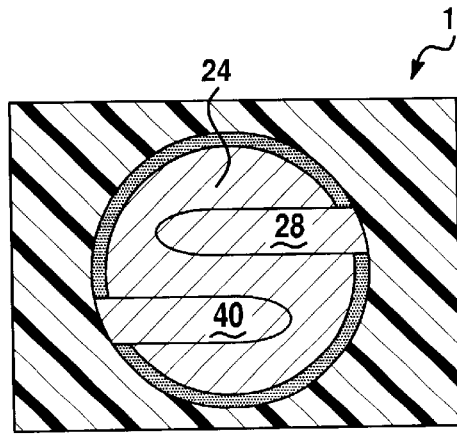
Figure 1G:
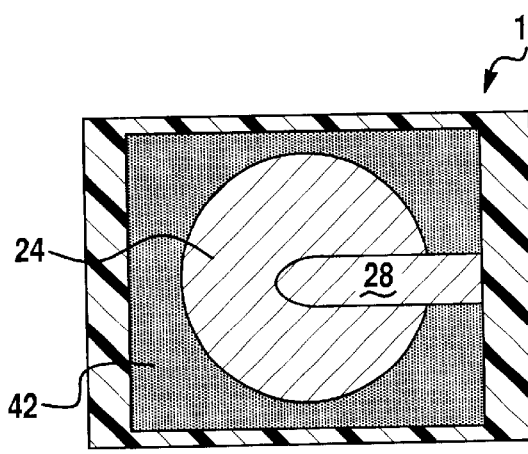
Figure 1H:
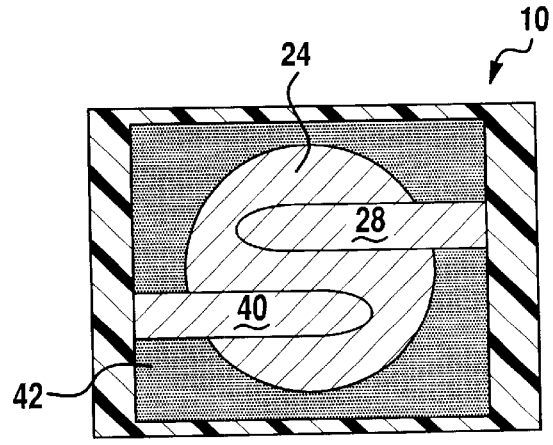
Figure 1I:
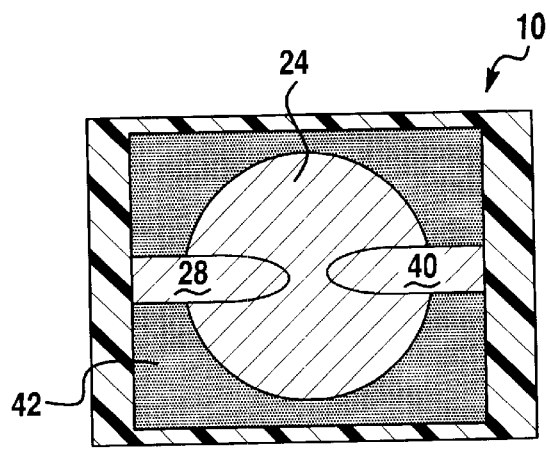

In the non-limiting embodiment illustrated in FIG. 1f, via-forming region 24 is generally circular in shape, and circuit assembly 10 includes a pair of substantially identical tabs or protrusions 28, 40 that extend into via 26 and are aligned in an "offset" manner. In the non-limiting embodiment illustrated in FIG. 1g, stencil layer or solder mask 22 has been conventionally removed from a generally square shaped area or region 42 which surrounds region 24 and/or via 26. In the non-limiting embodiment illustrated in FIG. 1h, stencil layer or solder mask 22 has been conventionally removed from a generally square shaped area or region 42 which surrounds region 24 and/or via 26. Additionally, in this non-limiting embodiment, circuit assembly 10 includes a pair of substantially identical tabs or protrusions 28, 40 that extend into via 26 and are aligned in an "offset" manner. In the non-limiting embodiment illustrated in FIG. 1i, stencil layer or solder mask 22 has been conventionally removed from a generally square shaped area or region 42 which surrounds region 24 and/or via 26. Additionally, in this non-limiting embodiment, circuit assembly 10 includes a pair of substantially identical tabs or protrusions 28, 40 which extend into via 26 and which are substantially and axially/longitudinally aligned (e.g., the longitudinal axis of tab 28 is aligned with the longitudinal axis of tab 40).

Referring now to FIG. 2 and FIGS. 2a–2i, there is shown a circuit assembly 50, which is made in accordance with the teachings of a second embodiment of the invention. Circuit assembly 50 is substantially identical to circuit assembly 10 with the exception that conductive member 20 has been replaced with a pre-circuit assembly or portion 52. Pre-circuit assembly or portion 52 includes a core metal portion 56 which is preferably manufactured and/or formed from a conventional aluminum, and a pair of electrically conductive layers 54, 58, which are respectively attached to the bottom surface and the top surface of core metal portion 56 and which are preferably manufactured and/or formed from a conventional copper material. A portion, "tab", or protrusion 60 of pre-circuit assembly 52 (e.g., that portion of member 52 not removed from region 59) remains substantially and horizontally "suspended" and/or extends within region 59. Protrusion 60 may be formed, designed and/or shaped in a variety of manners, including for example and without limitation, in a manner substantially similar to the various shapes, structures and designs previously described and illustrated in FIGS. 1a–1i. Protrusion 60 functions in a substantially identical manner as protrusion 28 and improves solder wetting within the blind via 61 (i.e., the gap 63 which is formed between protrusion 60 and the copper core 12 is effective to attract and/or "draw in" fluids such as molten solder, thereby promoting the joining and/or connection of layer 54 and copper core 12). Additionally, tab 60 can be bonded with conductive adhesive or metallurgically welded or bonded to core 12. Like via 26, via 61 has a relatively large perimeter or diameter (e.g., twice as large as conventional via designs).

Figure 2:
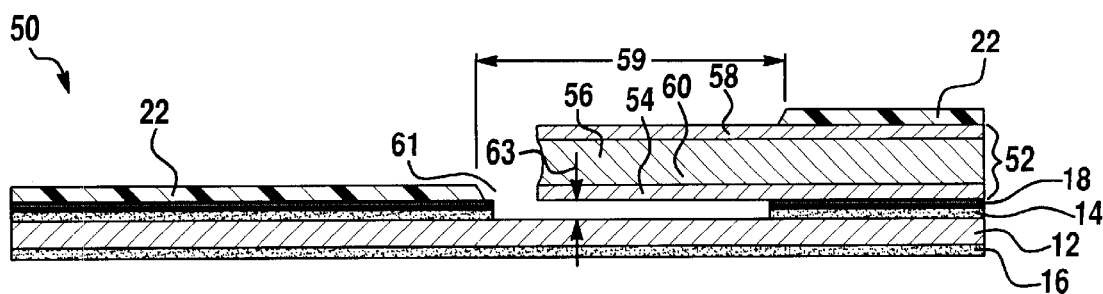
FIG. 2 is a sectional side view of a multi-layer circuit board including a "blind" via or cavity which is formed in accordance with the teachings of a second embodiment of the invention.
Figure 2A:
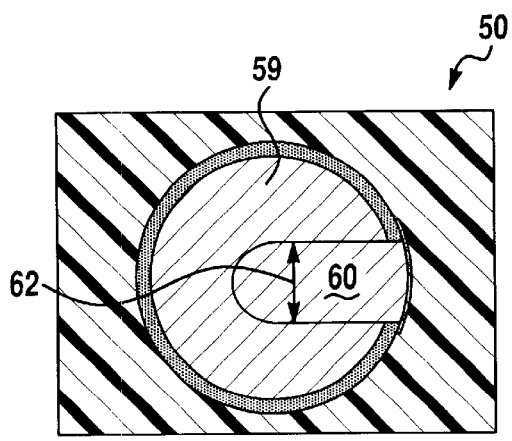
FIGS. 2a–2i are top views illustrating various non-limiting embodiments of the blind via or cavity shown in FIG. 2.
Figure 2B:
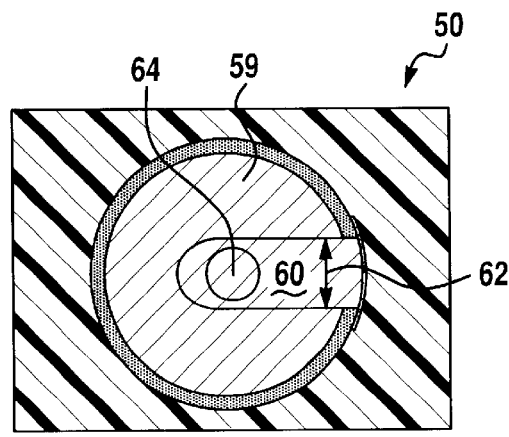
Figure 2C:
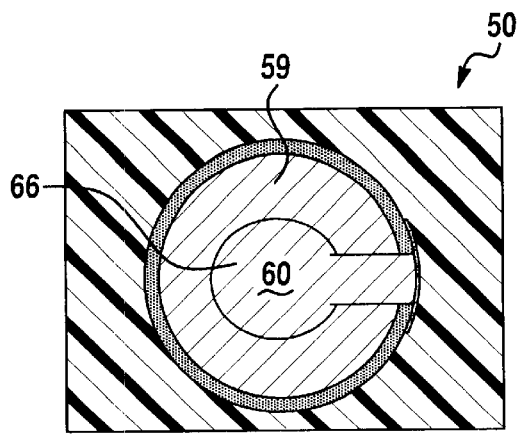
Figure 2D:
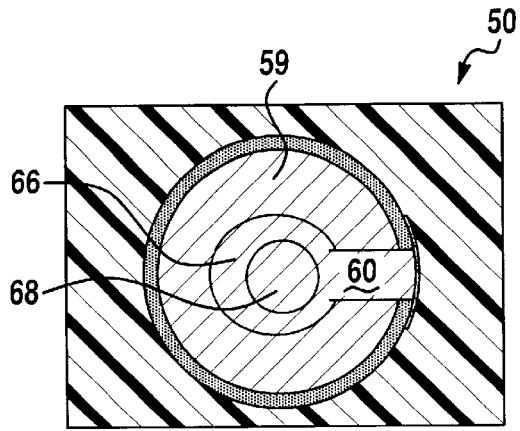
Figure 2E:
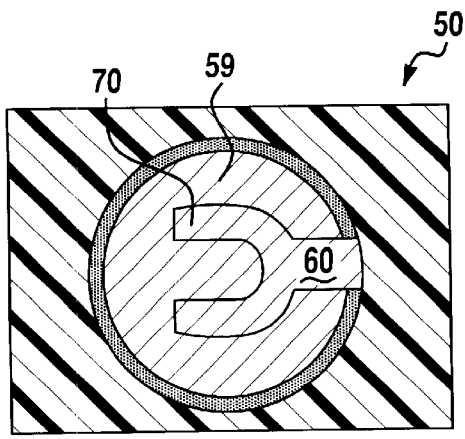

Projection 60 may be formed in a variety of manners, including for example and without limitation, the various shapes, structures and designs illustrated in FIGS. 2a –2i. In one non-limiting embodiment, which is illustrated in FIG. 2a, via-forming region 59 is generally circular in shape and has a diameter that is approximately three times as large as the width 62 of elongated protrusion 60. In another non-limiting embodiment, which is illustrated in FIG. 2b, via-forming region 59 is generally circular in shape and has a diameter that is approximately four times as large as the width 62 of protrusion 60. Protrusion 60 is generally elongated and includes a circular aperture 64, which is formed in the approximate center of symmetry of region 59 and/or via 61. In another non-limiting embodiment, which is illustrated in FIG. 2c, via-forming region 59 is generally circular in shape, and protrusion 60 is generally "pan-shaped" and has an enlarged and generally circular portion 66 which is suspended in the approximate center of symmetry of region 59 and/or via 61. In another non-limiting embodiment, which is illustrated in FIG. 2d, via-forming region 59 is generally circular in shape, and protrusion 60 is generally "pan-shaped" and has an enlarged and generally circular portion 66, including an aperture 68, which is suspended and/or disposed in the approximate center of symmetry of region 59 and/or via 61. In another non-limiting embodiment, which is illustrated in FIG. 2e, via-forming region 59 is generally circular in shape, and protrusion 60 is "forked" or "pronged" and includes a generally "U"-shaped portion 70 which is suspended and/or disposed in the approximate center of symmetry of region 59 and/or via 61.

Figure 2F:
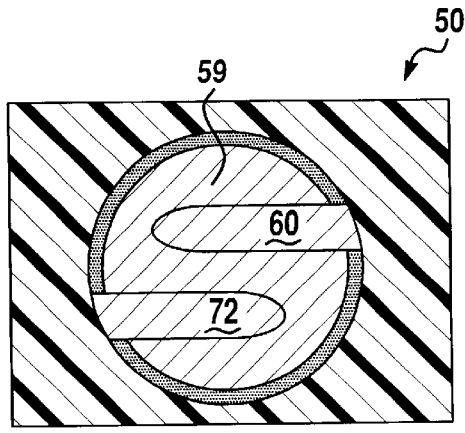
Figure 2G:
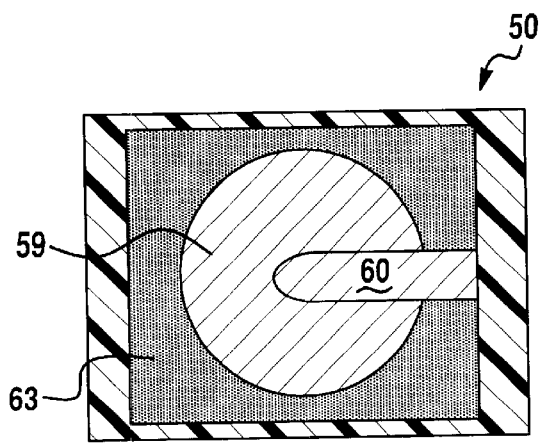
Figure 2H:
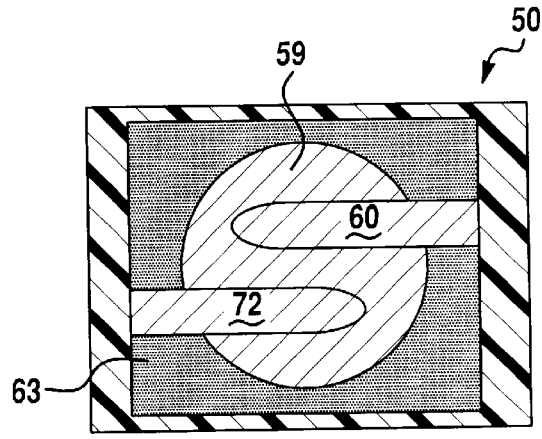
Figure 2I:
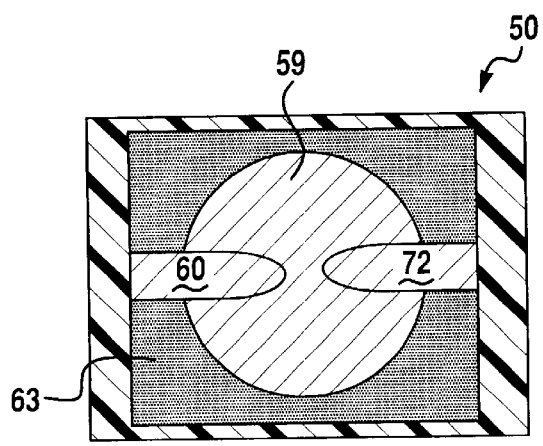

In the non-limiting embodiment illustrated in FIG. 2f, via-forming region 59 is generally circular in shape, and circuit assembly 50 includes a pair of substantially identical tabs or protrusions 60, 72 that extend into via 61 and are aligned in an "offset" manner. In the non-limiting embodiment illustrated in FIG. 2g, stencil layer or solder mask 22 has been conventionally removed from a generally square shaped area or region 42 which surrounds region 59 and/or via 61. In the non-limiting embodiment illustrated in FIG. 2h, stencil layer or solder mask 22 has been conventionally removed from a generally square shaped area or region 63 which surrounds region 59 and/or via 61. Additionally, in this non-limiting embodiment, circuit assembly 50 includes a pair of substantially identical tabs or protrusions 60, 72 that extend into via 61 and are aligned in an "offset" manner. In the non-limiting embodiment illustrated in FIG. 2i, stencil layer or solder mask 22 has been conventionally removed from a generally square shaped area or region 63 which surrounds region 59 and/or via 61. Additionally, in this non-limiting embodiment, circuit assembly 50 includes a pair of substantially identical tabs protrusions 60, 72 which extend into via 61 and are substantially and axially aligned (e.g., the longitudinal axis of tab 60 is aligned with the longitudinal axis of tab 72).

Referring now to FIG. 3, and FIGS. 3a–3i, there is shown a circuit assembly 80 having a "blind" via or aperture 110 which is made in accordance with the teachings of another embodiment of the invention. Circuit assembly 80 is formed by "building up" or sequentially adding various layers of certain materials to a core member 82, in a conventional manner. Core member 82 is manufactured and/or formed from an electrically conductive material such as copper or a metallic and electrically conductive foil material. A pair of layers of insulating or dielectric material or epoxy 84, 86 are respectively applied/coupled to and "cover" the "top" and "bottom" surfaces of member 82. A pair of layers of adhesive material 88, 90 which in the preferred embodiment of the invention comprise a "Z-flex" adhesive material, are respectively applied to and/or coupled to and substantially "cover" or coat the "top" surface of epoxy layer 84 and the "bottom" surface of epoxy layer 86. Pre-circuit assemblies 92, 94 are respectively connected, coupled, and/or attached to a portion of the epoxy layers 84, 86 by way of adhesives 88, 90 which are disposed between and operatively bond dielectric layers 84, 86 and pre-circuit assemblies 92, 94. Pre-circuit assemblies 92, 94 respectively include core metal portions 96, 97 which are preferably manufactured and/or formed from conventional aluminum, and pairs of electrically conductive layers 98, 100, and 102, 104 which are respectively attached to the bottom surfaces and the top surfaces of core metal portions 96, 97 and which are preferably manufactured and/or formed from a conventional copper material.

In one non-limiting embodiment of the invention, pre-circuit assemblies 92, 94 are connected, coupled, and/or attached to adhesive materials 88, 90 and dielectric layers 84, 86 by use of a known and conventional laminating process such as a conventional "one-step" laminating process. Circuit assembly 80 further includes a conventional solder-mask 106 which is conventionally coupled or attached to pre-circuit assembly 92 in one portion of the circuit assembly 80 (i.e., in the portion containing pre-circuit assembly 92) and is conventionally coupled or attached to adhesive material 88 in a second portion of the circuit assembly (i.e., in that portion not containing pre-circuit assembly 92). In a non-limiting embodiment, solder mask 106 may also be applied to assembly 94 and layer 90 to prevent shorting and to protect the circuit, as well as aiding to hold circuits 92 and 94 to the core 82.

Certain portions of solder-mask 106, pre-circuit assembly 92, adhesive materials 88, 90 dielectric materials 84, 86 and core member 82 have been removed from an area or region 108 of the circuit assembly 80 in a known and conventional manner such as by drilling, punching, photo-imaging, and/or selective etching, thereby creating a cavity or "blind" via 110 within circuit assembly 80. A "second" solder mask (or an electrically insulating) material 116 is disposed within via 110 and has been attached, coupled and/or adhered to core member 82, dielectric layers 84, 86 and adhesive layers 88, 90 thereby covering member 82 and layers 84, 86 within via 110. As shown, electrically conductive layer 102 is "exposed" and/or remains within area or region 108, thereby allowing an electrical connection to be made through blind via or cavity 110 to pre-circuit assembly 94. A portion, "tab", or protrusion 112 of layer 100 (e.g., that portion of layer 100 not removed from portion 108) remains substantially and horizontally "suspended" and/or extending within region 108. The protrusion 112 improves solder wetting within the blind via 110. Particularly, the gap 114 which is formed between protrusion 112 and the pre-circuit assembly 94 is effective to attract and/or "draw in" fluids such as molten solder or other conductive material, thereby promoting the joining and/or through welding connection of pre-circuit assemblies 92 and 94.

It should be appreciated that an electrically conductive material (e.g., solder) can be disposed or placed within blind via 110, thereby allowing for the selective formation of desired interconnection strategies and/or component connection strategies (e.g., between layer 102 and layer 100). By eliminating the annular ring used in prior via designs, the adhesive which is required to hold an annular ring in place is substantially eliminated from the area or region within the via 110. In this manner, the adhesives 88, 90 are substantially prevented from flowing inside the via 110 during the lamination process, thereby substantially preventing the adhesives 88, 90 from contaminating the solder or bonding area. Additionally, the perimeter or diameter of region 108 or via 110 is relatively large or substantially larger than (e.g., twice as large as) the perimeter or diameter utilized in prior via designs. The tab or protrusion 112, which extends over this larger area provides a solder interconnect area (e.g., an area where solder may be placed to mechanically and electrically connect pre-circuit assemblies 92, 94) which is relatively remote from the adhesive materials 88, 90, thereby further reducing the likelihood that the adhesive materials 88, 90 contaminate the solder area. The perimeter formed and/or created of the adhesive materials 88, 90 and solder mask 116 also prevents solder that is introduced into via 110 from flowing outside of via 110. Solder-mask 106 further assists in preventing the flow of solder outside of via 110, but is not required due to the function of adhesive material 88, 90. Hence, in alternate embodiments, solder-mask 106 may be eliminated.

Figure 3:
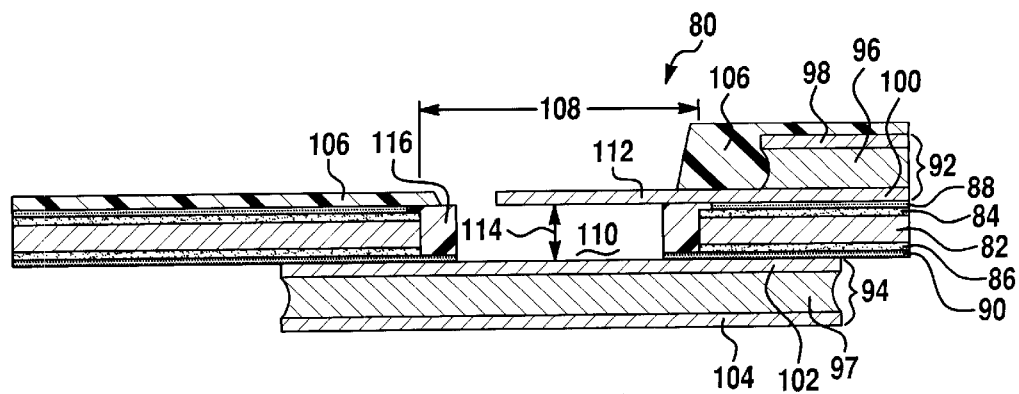
FIG. 3 is a sectional side view of a multi-layer circuit board including a "blind" via or cavity which is formed in accordance with the teachings of a third embodiment of the invention.

Furthermore, it will be recognized that solder mask 116 which is at least partially covering said core member 82 allows electrical signals to be communicated between pre-circuit assembly 92 and pre-circuit assembly 94, while inhibiting and/or preventing electrical signals from being communicated between pre-circuit assemblies 92, 94 and member 82. Additionally, solder mask 116 also assists in preventing adhesives 88, 90 from flowing inside via 100. Especially adhesive 88, as can be seen in FIG. 3, is substantially and/or completely shielded from via 110 thereby substantially and/or completely preventing adhesive 88 from contaminating the solder area.

Figure 3A:
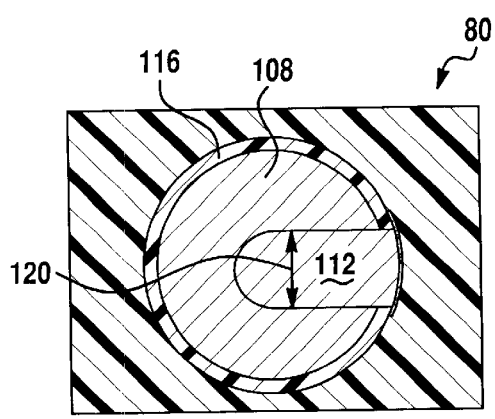
FIGS. 3a–3i are top views illustrating various non-limiting embodiments of the blind via or cavity shown in FIG. 3.
Figure 3B:
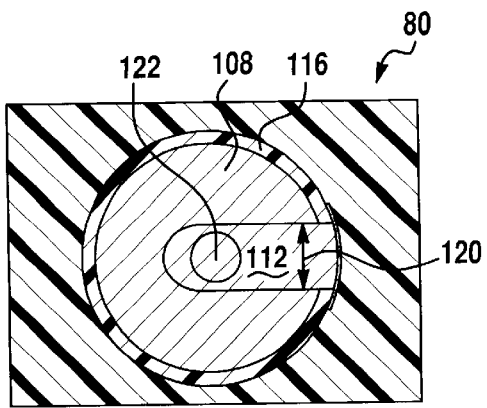
Figure 3C:
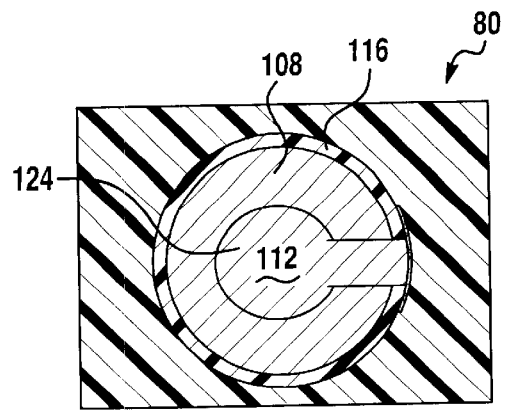
Figure 3D:
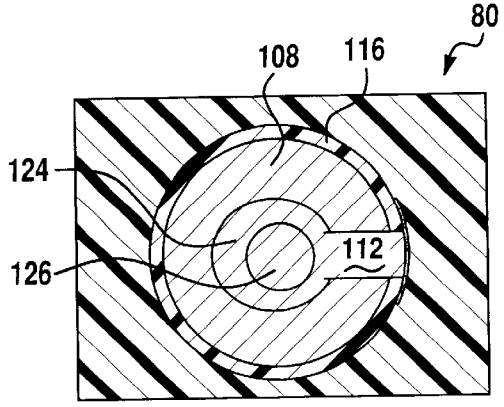
Figure 3E:
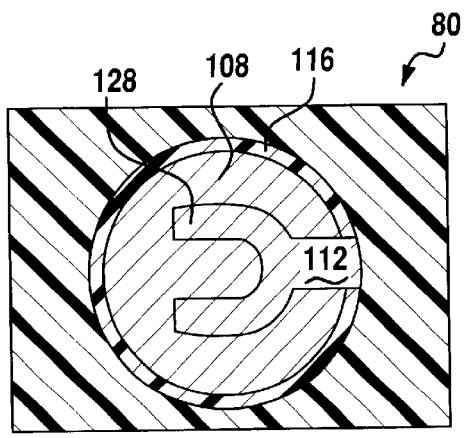

Projection 112 may be formed in a variety of manners, including for example and without limitation, the various shapes, structures and designs illustrated in FIGS. 3a–3i. In one non-limiting embodiment, which is illustrated in FIG. 3a, via-forming region 108 is generally circular in shape and has a diameter that is approximately three times as large as the width 120 of elongated protrusion 112. In another non-limiting embodiment, which is illustrated in FIG. 3b, via-forming region 108 is generally circular in shape and has a diameter that is approximately four times as large as the width 120 of protrusion 112. Protrusion 112 is generally elongated and includes a circular aperture 122, which is formed in the approximate center of symmetry of region 108 and/or via 110. In another non-limiting embodiment, which is illustrated in FIG. 3c, via-forming region 108 is generally circular in shape, and protrusion 112 is generally "pan-shaped" and has an enlarged and generally circular portion 124 which is suspended in the approximate center of symmetry of region 108 and/or via 110. In another non-limiting embodiment, which is illustrated in FIG. 3d, via-forming region 108 is generally circular in shape, and protrusion 112 is generally "pan-shaped" and has an enlarged and generally circular portion 124, including an aperture 126, which is suspended and/or disposed in the approximate center of symmetry of region 108 and/or via 110. In another non-limiting embodiment, which is illustrated in FIG. 3e, via-forming region 108 is generally circular in shape, and protrusion 112 is "forked" or "pronged" and includes a generally "U"-shaped portion 128 which is suspended and/or dispose in the approximate center of symmetry of region 108 and/or via 110.

Figure 3F:
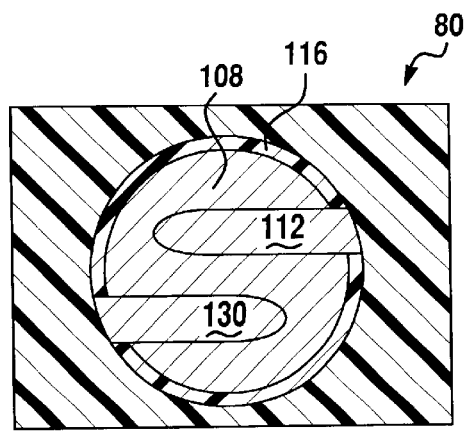
Figure 3G:
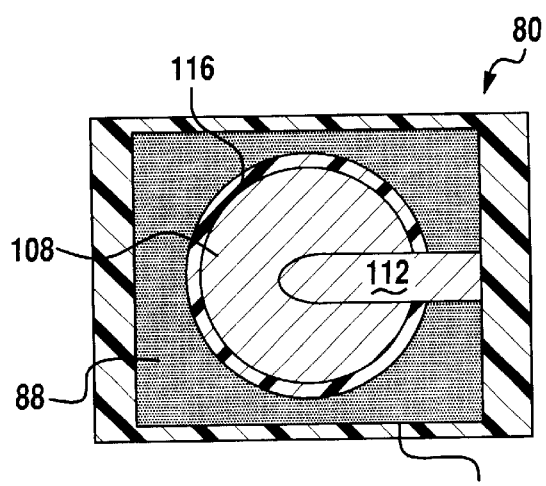
Figure 3H:
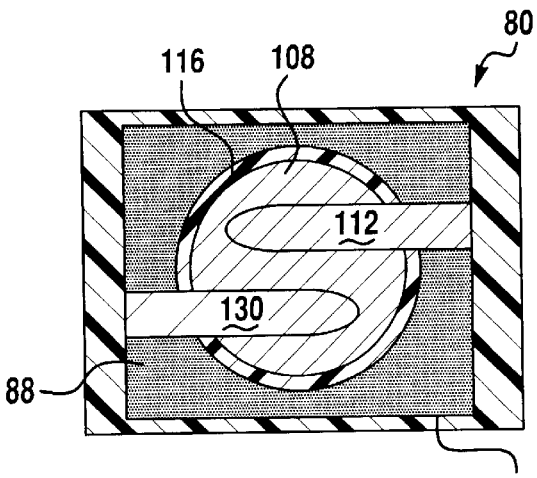
Figure 3I:
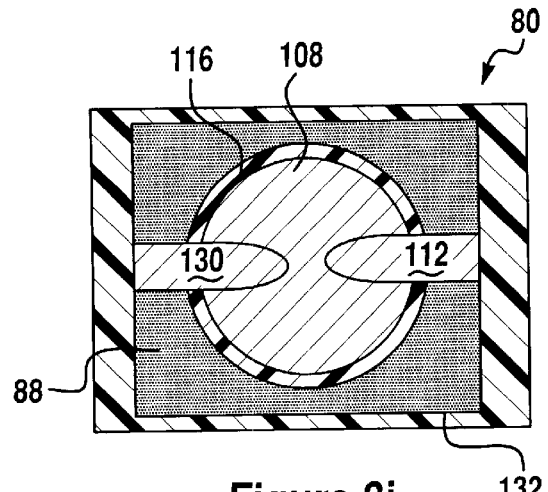

In the non-limiting embodiment illustrated in FIG. 3f, via-forming region 108 is generally circular in shape, and circuit assembly 80 includes a pair of substantially identical tabs or protrusions 112, 130 which extend into region 108 or via 110 and are aligned in an "offset" manner. In the non-limiting embodiment illustrated in FIG. 3g, stencil layer or solder mask 106 has been conventionally removed from a generally square shaped area or region 132 which surrounds region 108 and/or via 110. In the non-limiting embodiment illustrated in FIG. 3h, stencil layer or solder mask 106 has been conventionally removed from a generally square shaped area or region 132 which surrounds region 108 and/or via 110. Additionally, in this non-limiting embodiment, circuit assembly 80 includes a pair of substantially identical tabs or protrusions 112, 130, which extend into via 110 and are aligned in an "offset" manner. In the non-limiting embodiment illustrated in FIG. 3i, stencil layer or solder mask 106 has been conventionally removed from a generally square shaped area or region 132 which surrounds region 108 and/or via 112. Additionally, in this non-limiting embodiment, circuit assembly 80 includes a pair of substantially identical tabs or protrusions 112, 130 which extend into via 110 and are substantially and axially aligned (e.g., the longitudinal axis of tab 112 is aligned with the longitudinal axis of tab 130).

Referring now to FIG. 4 and FIGS. 4a–4i, there is shown a circuit assembly 140 that is made in accordance with the teachings of another embodiment of the invention. Circuit assembly 140 is substantially identical to circuit assembly 80 with the exception that "blind" via or aperture 110 has been replaced with "pass through" via (i.e., a via which extends through circuit board assembly 140) or aperture 142. "Pass-through" via or aperture 142 is created by drilling, punching and/or selective etching of certain portions of pre-circuit assemblies 92, 94, adhesive materials 88, 90, dielectric materials 84, 86, and core member 82. As shown, a portion of pre-circuit assembly 94 is "exposed" and/or remains within area or region 143, thereby allowing an electrical connection to be made through aperture 142 to pre-circuit assembly 94. Furthermore, the portions or layers 97, 102, 104 cooperatively form an annular "pad" or ring, which operatively holds or retains solder within cavity 142. Cavity 142 also acts as a vent hole to allow gas to escape from the cavity to prevent the creation of a void or air entrapment within the via.

A portion, "tab", or protrusion 112 of layer 100 (e.g., that portion of layer 100 not removed from portion 143) remains substantially and horizontally "suspended" and/or extending within region 143. The protrusion 112 improves solder wetting within the aperture 142. Particularly, the gap 114 which is formed between protrusion 112 and the pre-circuit assembly 94 is effective to attract and/or "draw in" fluids such as molten solder, thereby promoting the joining and/or connection of pre-circuit assemblies 92, 94.

It should be appreciated that an electrically conductive material (i.e., solder, or conductive adhesive) can be disposed or placed within aperture 142, thereby allowing for the selective formation of desired interconnection strategies and/or component connection strategies.

Figure 4:
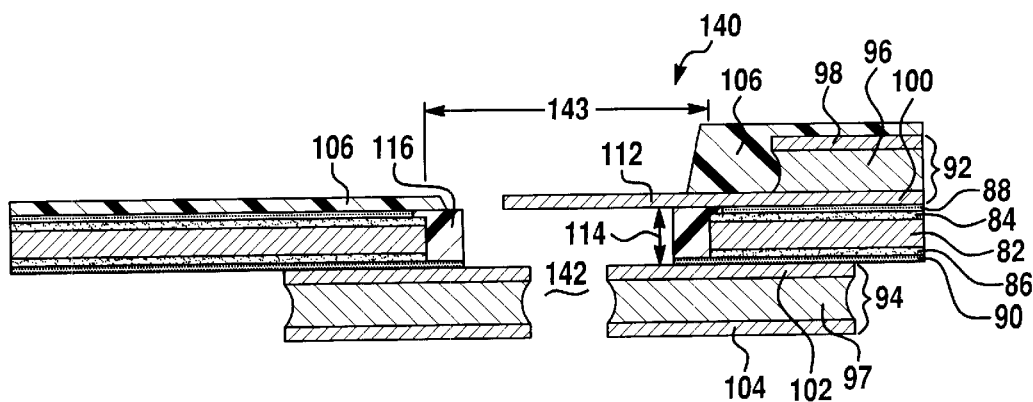
FIG. 4 is a sectional side view of a multi-layer circuit board including a "pass through" type via or cavity which is formed in accordance with the teachings of a fourth embodiment of the invention.
Figure 4A:
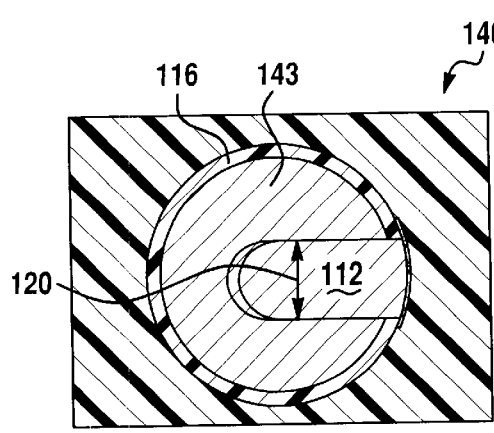
FIGS. 4a–4i are top views illustrating various non-limiting embodiments of the "pass through" via or cavity shown in FIG. 4.
Figure 4B:
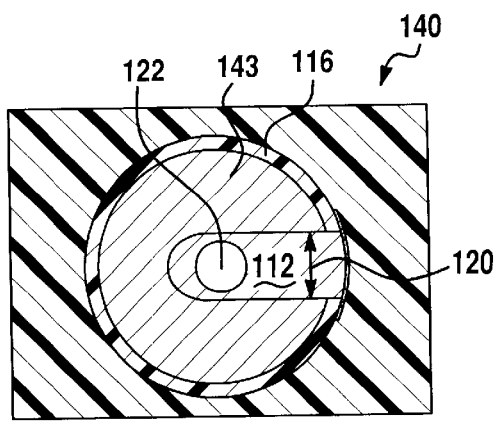
Figure 4C:
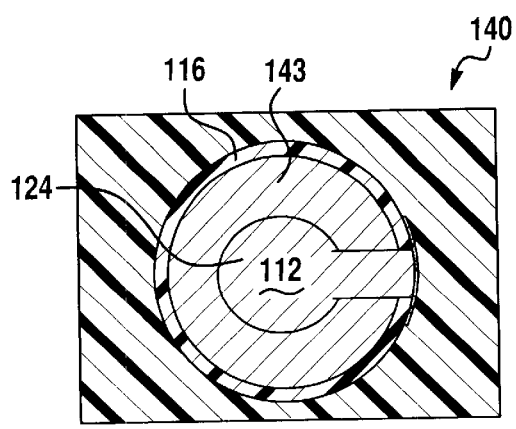
Figure 4D:
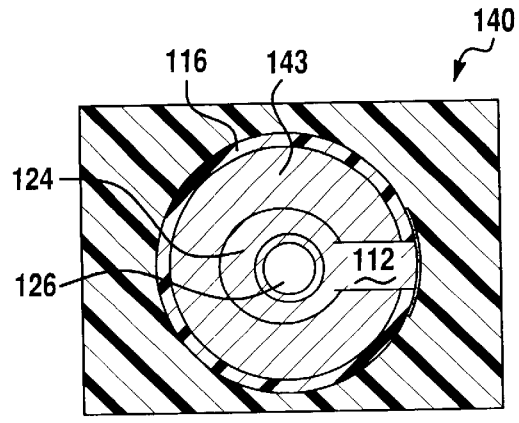
Figure 4E:
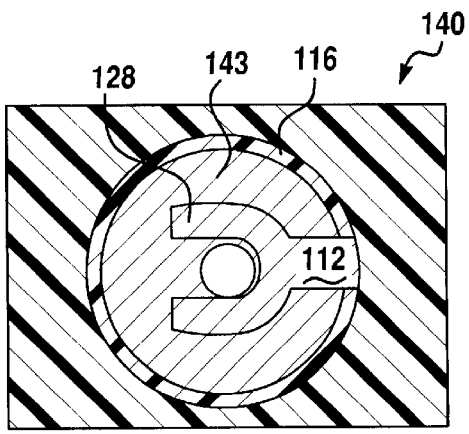

Projection 112 may be formed in a variety of manners, including for example and without limitation, the various shapes, structures and designs illustrated in FIGS. 4a–4i. In one non-limiting embodiment, which is illustrated in FIG. 4a, via-forming region 143 is generally circular in shape and has a diameter that is approximately three times as large as the width 120 of elongated protrusion 112. In another non-limiting embodiment, which is illustrated in FIG. 4b, via-forming region 143 is generally circular in shape and has a diameter that is approximately four times as large as the width 120 of protrusion 112. Protrusion 112 is generally elongated and includes a circular aperture 122 that is formed in the approximate center of symmetry of region 143 and/or via 142. In another non-limiting embodiment, which is illustrated in FIG. 4c, via-forming region 143 is generally circular in shape, and protrusion 112 is generally "pan-shaped" and has an enlarged and generally circular portion 124 which is suspended in the approximate center of symmetry of region 143 and/or via 142. In another non-limiting embodiment, which is illustrated in FIG. 4d, via-forming region 143 is generally circular in shape, and protrusion 112 is generally "pan-shaped" and has an enlarged and generally circular portion 124, including an aperture 126, which is suspended and/or disposed in the approximate center of symmetry of region 143 and/or via 142. In another non-limiting embodiment, which is illustrated in FIG. 4e, via-forming region 143 is generally circular in shape, and protrusion 112 is "forked" or "pronged" and includes a generally "U"-shaped portion 128 which is suspended and/ or disposed in the approximate center of symmetry of region 143 and/or via 142.

Figure 4F:
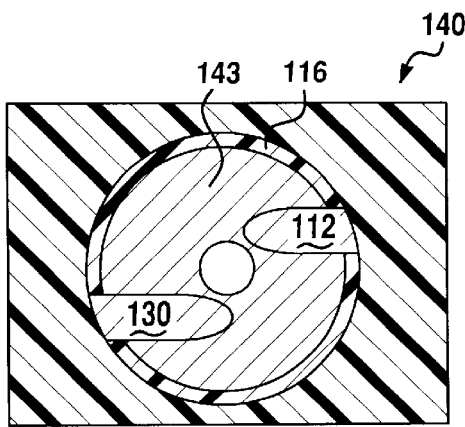
Figure 4G:
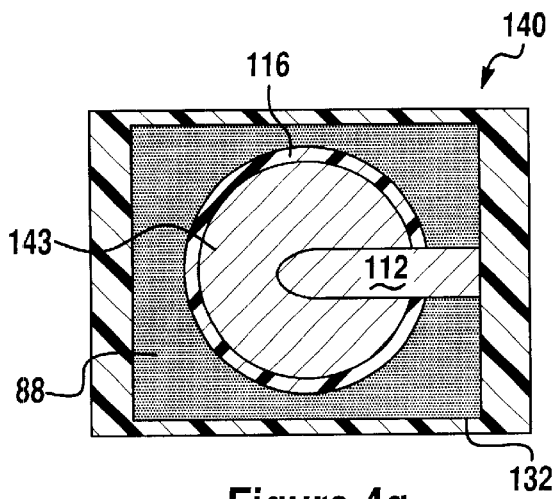
Figure 4H:
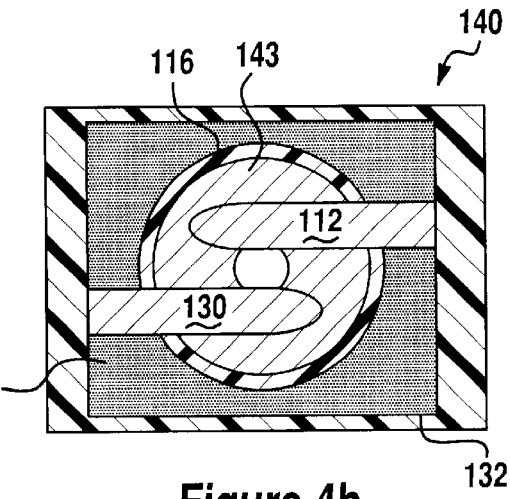
Figure 4I:
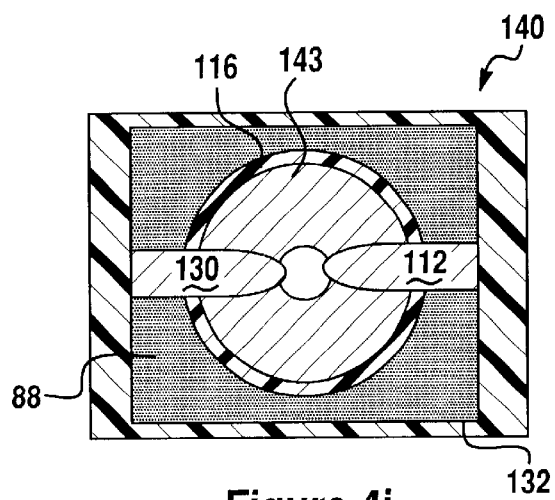

In the non-limiting embodiment illustrated in FIG. 4f, via-forming region 143 is generally circular in shape, and circuit assembly 80 includes a pair of substantially identical tabs or protrusions 112, 130 which extend into via 110 and are aligned in an "offset" manner. In the non-limiting embodiment illustrated in FIG. 4g, stencil layer or solder mask 106 has been conventionally removed from a generally square shaped area or region 132 which surrounds region 143 and/or via 142. In the non-limiting embodiment illustrated in FIG. 4h, stencil layer or solder mask 106 has been conventionally removed from a generally square shaped area or region 132 which surrounds region 143 and/or via 142. Additionally, in this non-limiting embodiment, circuit assembly 80 includes a pair of substantially identical tabs or protrusions 112, 130, which extend into via 142 and are aligned in an "offset" manner. In the non-limiting embodiment illustrated in FIG. 4i, stencil layer or solder mask 106 has been conventionally removed from a generally square shaped area or region 132 which surrounds region 143 and/or via 142. Additionally, in this non-limiting embodiment, circuit assembly 80 includes a pair of substantially identical tabs or protrusions 112, 130 which extend into via 142 and are substantially and axially aligned (e.g., the longitudinal axis of tab 112 is aligned with the longitudinal axis of tab 130).

Referring now to FIGS. 5 and 5a–5c, there is shown a circuit assembly 150, which is made in accordance with the teachings of another embodiment of the invention. Circuit assembly 150 is substantially identical to circuit assembly 50 with the exception that cavity and/or "blind" via 26 has been replaced by cavity and/or "blind" via 152. As shown best in FIGS. 5a–5c, certain portions of pre-circuit assembly 52, adhesive layer 18 and dielectric layer 14 have been removed from an area or region 151 of the circuit assembly 150 in a known and conventional manner such as by drilling, punching and/or selective etching, thereby creating a cavity 152 which has a generally elongated and/or rectangular shape with a width 156, a length 158 and rounded edges. Like via 26, via 152 has a relatively large perimeter (e.g., twice as large as conventional via designs).

Figure 5:
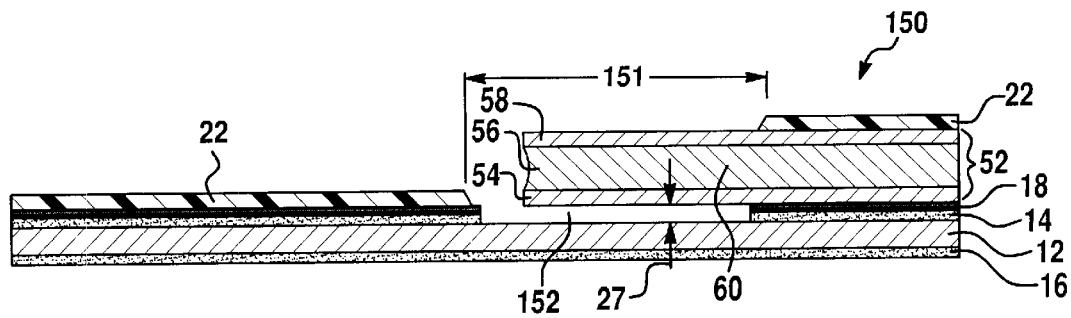
FIG. 5 is a sectional side view of a multi-layer circuit board including a "blind" via or cavity which is formed in accordance with the teachings of a fifth embodiment of the invention.
Figure 5A:
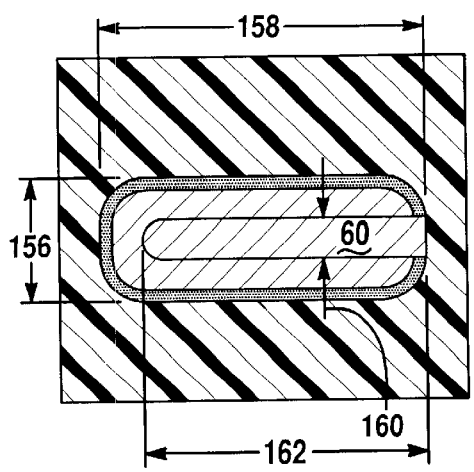
FIGS. 5a–5c are top views illustrating various non-limiting embodiments of the blind via or cavity shown in FIG. 5.
Figure 5B:
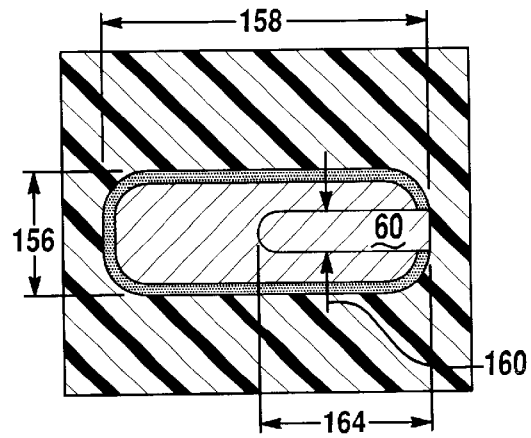
Figure 5C:
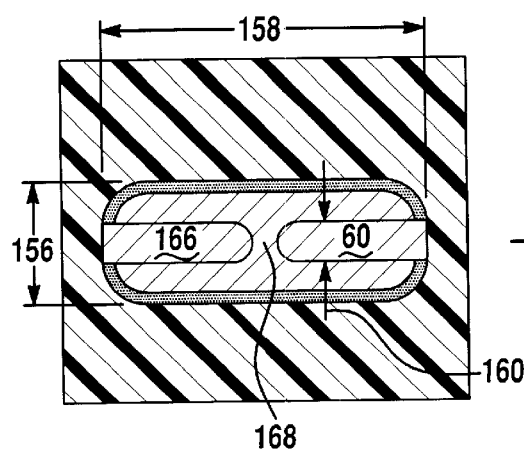

Again, protrusion 60 may be formed in a variety of manners including, for example and without limitation, the various structures and designs illustrated in FIGS. 5a–5c. In one non-limiting embodiment, which is illustrated in FIG. 5a, protrusion 60 has a width 160, which is approximately one third of width 156 of cavity 152. Additionally protrusion 60 has a length 162, which is only slightly shorter than length 158 of cavity 152. In another non-limiting embodiment, which is illustrated in FIG. 5b, protrusion 60 has a width 160, which is approximately one third of width 156 of cavity 152. Additionally protrusion 60 has a length 164, which is approximately one half of length 158 of cavity 152. In another non-limiting embodiment, which is illustrated in FIG. 5c, a second tab and/or protrusion 166 has been added. In this non-limiting embodiment, circuit assembly 52 includes a pair of substantially identical tabs or protrusions 60, 166 which extend into via 110 and are substantially and axially aligned (e.g., the longitudinal axis of tab 60 is aligned with the longitudinal axis of tab 166).

It should be understood that the invention is not limited to the exact embodiment or construction which has been illustrated and described but that various changes may be made without departing from the spirit and the scope of the invention.

What is claimed is:

1. A method for making a multi-layer circuit board comprising the steps of:
   providing a conductive core member having a first surface;
   providing an insulating layer;
   selectively coupling said insulating layer to said first surface;
   attaching a conductive layer to said first insulating layer;
   selectively removing a portion of said insulating layer from a first region of said multi-layer circuit board; and
   selectively removing a portion of said conductive layer from said first region, said portion of said conductive layer cooperating with said portion of said insulating layer to form a blind via within said multi-layer circuit board which extends to said conductive core member, and being further effective to form a protrusion of said conductive layer which extends over said blind via, said protrusion being effective to draw in liquids which are selectively inserted into said blind via.

2. The method of claim 1 further comprising the step of:
   selectively inserting conductive material into said blind via, effective to form a reliable connection between said conductive core member and said conductive layer.

3. The method of claim 1 wherein said insulating layer comprises a dielectric layer and an adhesive layer.

4. The method of claim 1 wherein said protrusion is generally "pan-shaped".

5. The method of claim 1 wherein said protrusion is generally forked shaped.

6. A method for making a multi-layer circuit board comprising the steps of:
   providing a conductive core member having a first and second surface;
   providing a first and second pre-circuit assembly, each having a first and second conductive layer and a core layer disposed between said first and second conductive layers;
   selectively applying a dielectric material to said first and second surfaces of said conductive core member;
   selectively attaching said first and second precircuit assemblies to said dielectric material on said respective first and second surface of said conductive core member; and
   selectively removing portions of said dielectric material, said conductive core member and said pre-circuit assembly within a region of said multi-layer circuit board effective to form a via which extends to said first conductive layer of said second pre-circuit assembly, and further effective to form a second portion of said first pre-circuit assembly which extends within said via and which is effective to draw in and retain conductive materials which are selectively inserted into said via, thereby providing a reliable connection between said first pre-circuit assembly and said second precircuit assembly.

7. The method of claim 6 wherein said conductive materials comprise molten solder.

8. The method of claim 6 further comprising the steps of:
   selectively placing a solder mask material within said via and over a second portion of said conductive core member such that said conductive materials which are inserted into said via do not metallurgically bond with said conductive core member.

9. The method of claim 6 wherein said second portion of said first pre-circuit assembly comprises a generally pan-shaped protrusion.

10. The method of claim 6 wherein said second portion of said first pre-circuit assembly comprises a first and second protrusion.

11. The method of claim 6 further comprising the step of removing a portion of said second pre-circuit assembly from said first region of said multi-layer circuit board, effective to cause said via to form a "pass through" via.

12. The method of claim 6 wherein said via has a perimeter of a certain size and further comprising the step of:
   increasing said certain size.

* * * * *